United States Patent [19]
Walker et al.

[11] Patent Number: 6,121,753
[45] Date of Patent: Sep. 19, 2000

[54] APPARATUS AND METHOD FOR TESTING AND INDICATING BATTERY CHARGE AND FUNCTIONALITY

[76] Inventors: Douglas W. Walker; Frank M. Ordaz, both of 1076 E. Front St., Unit A, Ventura, Calif. 93001

[21] Appl. No.: 09/009,663

[22] Filed: Jan. 20, 1998

Related U.S. Application Data

[60] Provisional application No. 60/036,343, Jan. 23, 1997.

[51] Int. Cl.[7] .................................................. H01M 10/46
[52] U.S. Cl. ..................................... 320/132; 320/DIG. 18
[58] Field of Search ..................................... 320/132, 134, 320/136, DIG. 18, DIG. 21; 429/426, 429, 432, 433; 340/635, 636

[56] References Cited

U.S. PATENT DOCUMENTS

| | | |
|---|---|---|
| 2,490,020 | 12/1949 | Enzler . |
| 2,615,946 | 10/1952 | Katzman . |
| 3,656,061 | 4/1972 | Mallory ................................ 324/434 X |
| 3,781,657 | 12/1973 | Dennstedt ................... 320/DIG. 21 X |
| 3,974,441 | 8/1976 | Van Den Haak . |
| 3,993,985 | 11/1976 | Chopard . |
| 4,024,523 | 5/1977 | Arnold . |
| 4,028,616 | 6/1977 | Stevens ................................... 324/433 |
| 4,313,079 | 1/1982 | Lee . |
| 4,423,379 | 12/1983 | Jacobs et al. ........................... 324/429 |
| 4,520,353 | 5/1985 | McAuliffe ................................ 324/429 |
| 4,626,765 | 12/1986 | Tanaka . |
| 4,719,428 | 1/1988 | Liebermann ............................ 324/436 |
| 4,808,130 | 2/1989 | Lee . |
| 5,105,180 | 4/1992 | Yamada . |
| 5,137,461 | 8/1992 | Bindra . |

FOREIGN PATENT DOCUMENTS 05 50 389 A1  7/1993  European Pat. Off. .

*Primary Examiner*—Edward H. Tso
*Attorney, Agent, or Firm*—Gene W. Arant

[57] ABSTRACT

A device for rapidly testing a battery includes a conditioning resistor and a depressible momentary type switch interposed in series between the conditioning resistor and the battery terminals, such that the closing of the switch allows current flow through the conditioning resistor in approximately the full amount the battery can generate when fully charged. In parallel with the conditioning resistor are a number of sets of voltage dividers and comparators working in conjunction with each other to compare a divided down battery voltage with a fixed voltage reference. Each comparator has an associated indicator light such that all the indicator lights will light up if the battery is at full capacity, but less than all the indicator lights will light up if the battery is at less than full capacity.

9 Claims, 3 Drawing Sheets

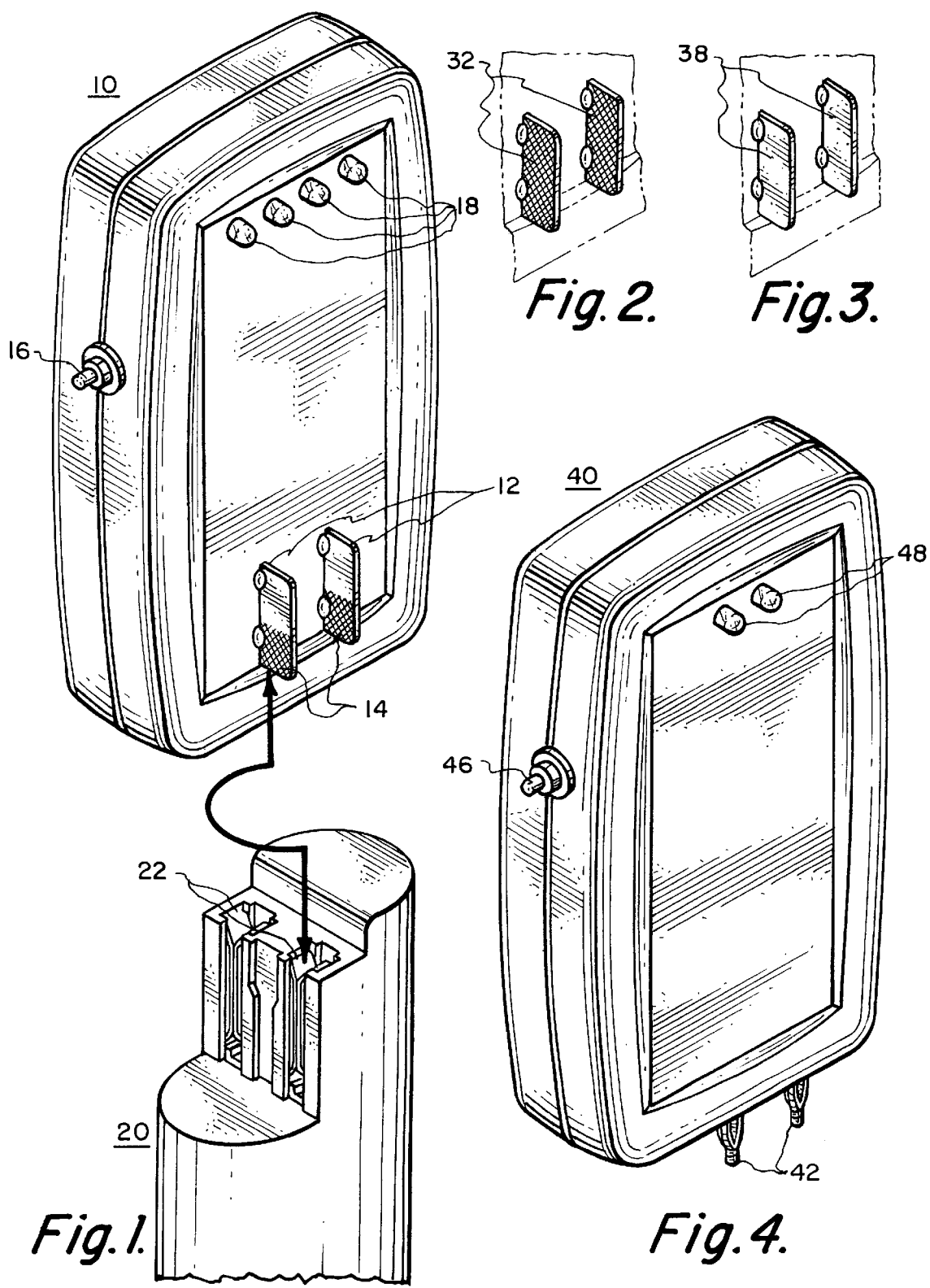

APPARATUS AND METHOD FOR TESTING AND INDICATING BATTERY CHARGE AND FUNCTIONALITY

RELATED APPLICATION

This application claims the benefit under Title 35 United States Code, §120 and §119(e) of pending United States provisional patent application Ser. No. 60/036,343 filed Jan. 23, 1997.

BACKGROUND OF THE INVENTION

The present invention relates to the field of battery charge and functionality testing. Developments in battery technology have increased battery storage capacities and overall battery performance. As a result, both non-rechargeable and rechargeable battery use has increased.

Batteries, and in particular rechargeable batteries, are used extensively in the medical and construction fields. This increased use of batteries has led to increased need for charge and battery maintenance. It is for example, particularly important for hospital personnel to quickly find sufficiently charged batteries in preparation for or during a surgical procedure.

As rechargeable batteries are not cheap, it is also important to maintain the batteries and to accurately verify when a battery needs to be replaced. With proper maintenance and monitoring, battery life and reliability can be increased.

Although battery testers are available on the market, there is a need for a tester which: can provided a quick indication of battery charge; reduce false indications; reduce the chance of inadvertent discharge; is compact, reliable, easy to use; and is inexpensive.

Often it is of great importance to determine charge level and functionality of a battery in a hurry. This is especially true in the medical profession where expediency is often critical.

Although several devices can provide quick checks of a battery's charge, they are inadequate in several respects. For example, a voltmeter or similar device can quickly measure a batteries voltage, however, it may allow a battery pack with a simple short cell to indicate a fully charged battery. Some testers utilize a resistive load heating element comprised of thermochromatic ink to give a visual read-out to the user. This method takes a period of time for a correct indication and may not adequately load a rechargeable battery. Some devices are integrated into the battery housing itself, possibly increasing leakage current and increasing battery cost. Additionally, such devices may not reliably withstand construction site elements or the high temperatures required for medical autoclave sterilization. Some devices even take five or more minutes to register battery charge level.

False indications are also a problem. Often debris or oxidation on the battery contacts or terminals can cause deteriorated performance and false battery charge indications. Rechargeable batteries in the medical field are particularly susceptible to oxidation or corrosion. This is due to the systematic exposure to autoclave heat and moisture that is required for sterilization.

False indications as to the actual voltage the battery can deliver when installed into the host device is also a problem. Batteries will often have a spring back voltage which is actually above the voltage the battery can actually deliver during use.

False indications can also occur in rechargeable batteries if there is a shorted cell. Such a failure could go undetected by typical charge indicators.

Inadvertent discharging of the testing device and the batteries is also a problem encountered by the prior art. If batteries are inadvertently left on the testing device, deletion of the internal energy source of the tester and also the draining of the rechargeable battery under test occurs.

Unlike the present invention, the prior art has not successfully addressed these many needs.

BRIEF DESCRIPTION OF THE DRAWINGS

FIG. 1 is a perspective view of a battery and a tester with partially abraded blade contacts.

FIG. 2 is a cut away section of the tester depicting fully abraded blade contacts.

FIG. 3 is a cut away section of the tester depicting non-abraded contacts.

FIG. 4 is a perspective view of an alternate embodiment of the tester with male pin type contacts.

DETAILED DESCRIPTION

Figure 5:
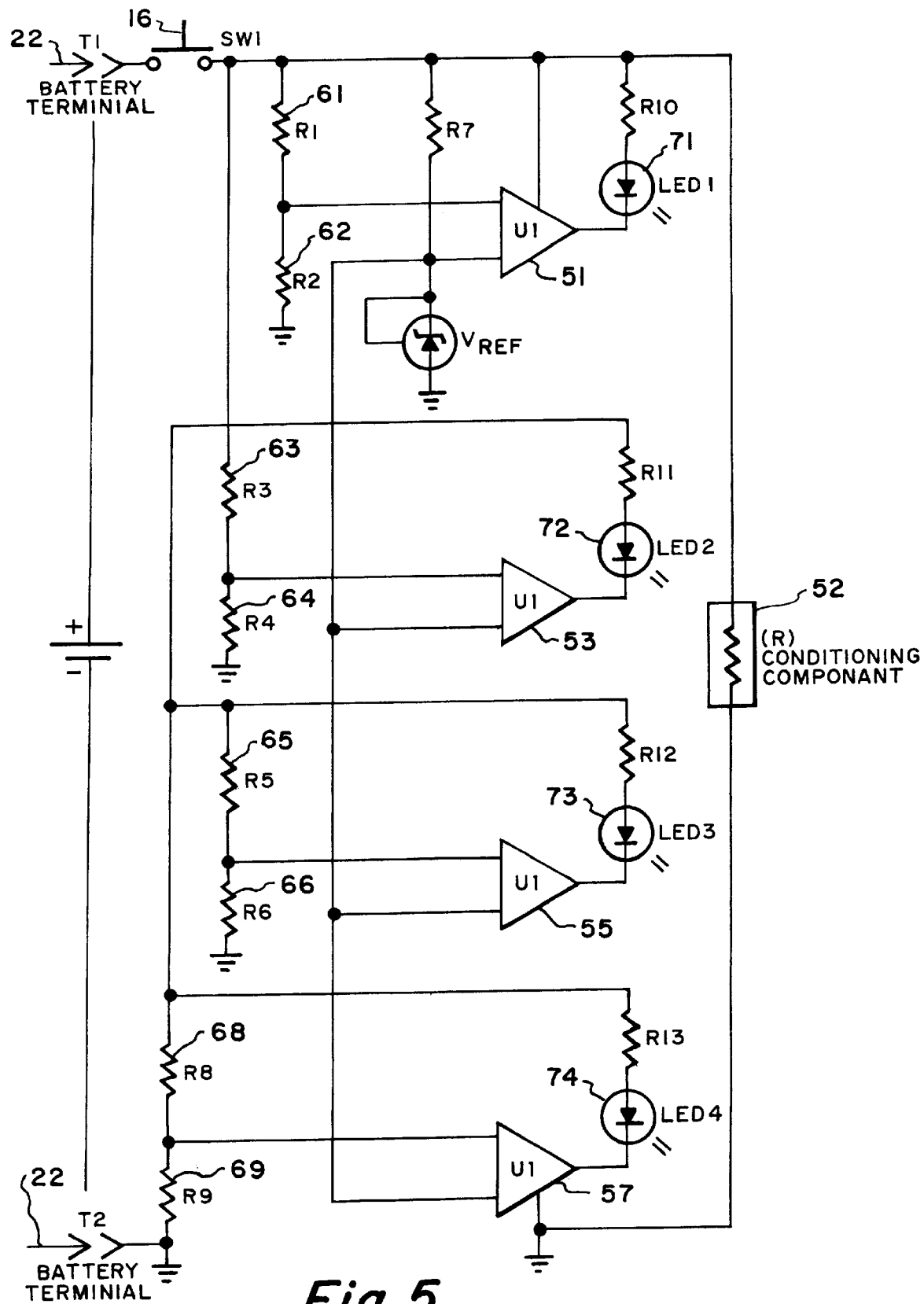
FIG. 5 is a circuit diagram of the tester circuitry.

The present invention provides a compact and portable instrument for use in quickly testing the charge and functionality of batteries. It reduces false indications and keeps battery contacts clean. It also eliminates the chance of inadvertent discharge.

FIG. 1 shows one embodiment of the invention. The tester 10 is shown with two blade type electrical contacts 12. The blade type contacts 12 are inserted in the battery 20 so that they mate with battery contacts or terminals 22. The blade type contacts 12 are partially abraded or textured 14 to provide frictional cleaning of battery contacts 22. The act of inserting the blade contacts 12 into engagement with battery contacts 22 cleans the battery contacts 22 thereby producing a better electrical connection than would otherwise be possible. Not only does the cleaning action of the contacts 12 help ensure a proper connection of battery contacts 22 with the tester contacts 12 to prevent false indications, the cleaning of the connections help remove any debris such as corrosion from battery contacts 22 thereby reducing the chances of inadequate electrical connection when installed in its host device. This in turn reduces the chances that a battery with corroded connections will be mistaken for a battery that has failed.

After mating of blade contacts 12 with battery contacts 22, depression of switch 16 will activate the tester's electronic circuitry to provide a charge and functionality check. The check or test may cause one of the lights or light emitting diodes 18 to illuminate indicating the voltage level at the battery contacts 22.

FIG. 2 shows fully abraded or textured blades 32 which can be used in place of the partially abraded blades 12. FIG. 3 shows blades 38 without abrading which can be used in place of the partially abraded blades 12.

FIG. 4 shows an alternate embodiment of the invention. The tester 40 is provided with male insertion type electrical connectors 42. The insertion type connectors 42 are for use with batteries with female type connectors adapted to receive the male insertion connectors 42. The connectors 42 can be abraded or textured to provide frictional cleaning of female battery contacts. After mating of the male connectors 42 with a battery, depression of switch 46 will activate the tester's electronic circuitry to provide a charge and functionality check. The check or test may cause one or more of the lights or light emitting diodes 48 to illuminate giving a pass or fail indication.

FIG. 5 shows the presently preferred embodiment of the tester's electronic circuitry when testing a battery of nominal 9.6 volts output. When the switch 16 is depressed and held, power is supplied to circuit from the rechargeable battery being tested. In the preferred embodiment the switch 16 is a depressible momentary type. This prevents it from being accidentally left on which could completely drain the charge from an unattended attached battery. Although a manually depressible momentary type switch is used for this purpose, an automated type switch could also be used for this purpose. By using the rechargeable battery under test as the source for powering the tester circuitry a more reliable, lower maintenance tester provided.

When the switch 16 is depressed and held, a conditioning load 52 is applied across the battery terminals 22. This load 52 provides a more accurate measure of the battery charge condition by drawing a large set current, such as 1 amp. This current value is chosen to be approximately equal to the full load current of the battery when fully charged. This load also eliminates any spring back and false top off charge, such as could be found in a battery with one shorted cell and the remaining cells functional. It will also condition a battery to find those needing charge or those with sufficient charge to indicate charging is complete.

Depressing the switch 16 also activates comparators 51, 53, 55, and 57, such as an LM339. The comparators 51, 53, 55, 57 have a fixed voltage reference Vref, such as a TL431, of 2.5 volts that is used for comparison with a divided down battery voltage. This divided down voltage is obtained by a series of resistors 61 and 62, 63 and 64, 65 and 66, 68 and 69. The voltage divider pairs are use to set to four different voltage levels at which the light emitting diodes, 71, 72, 73 and 74, illuminate. The light emitting diodes of LED's indicate the level of charge on the rechargeable battery. In this embodiment; LED 71 is set to illuminate if the battery voltage is above 10.4 volts, LED 72 is set to illuminate if the battery voltage is above 10.0 volts, LED 73 is set to illuminate if the battery voltage is above 9.2 volts, LED 74 is set to illuminate if the battery voltage is above 8.4 volts. Therefore the value of resistors 62, 64, 66, and 69 is selected at 10k ohms and the value of resistors 61, 63, 65, and 68 are selected at 31.6k ohms, 30.1k ohms, 26.7k ohms, and 23.7k ohms respectively. The voltage levels for indication are selected to correspond to about 100%, 75%, 25%, and 10% of the charge capacity of a typical 9.6 volt NiCa battery. These levels can be selected as desired.

Figure 6:
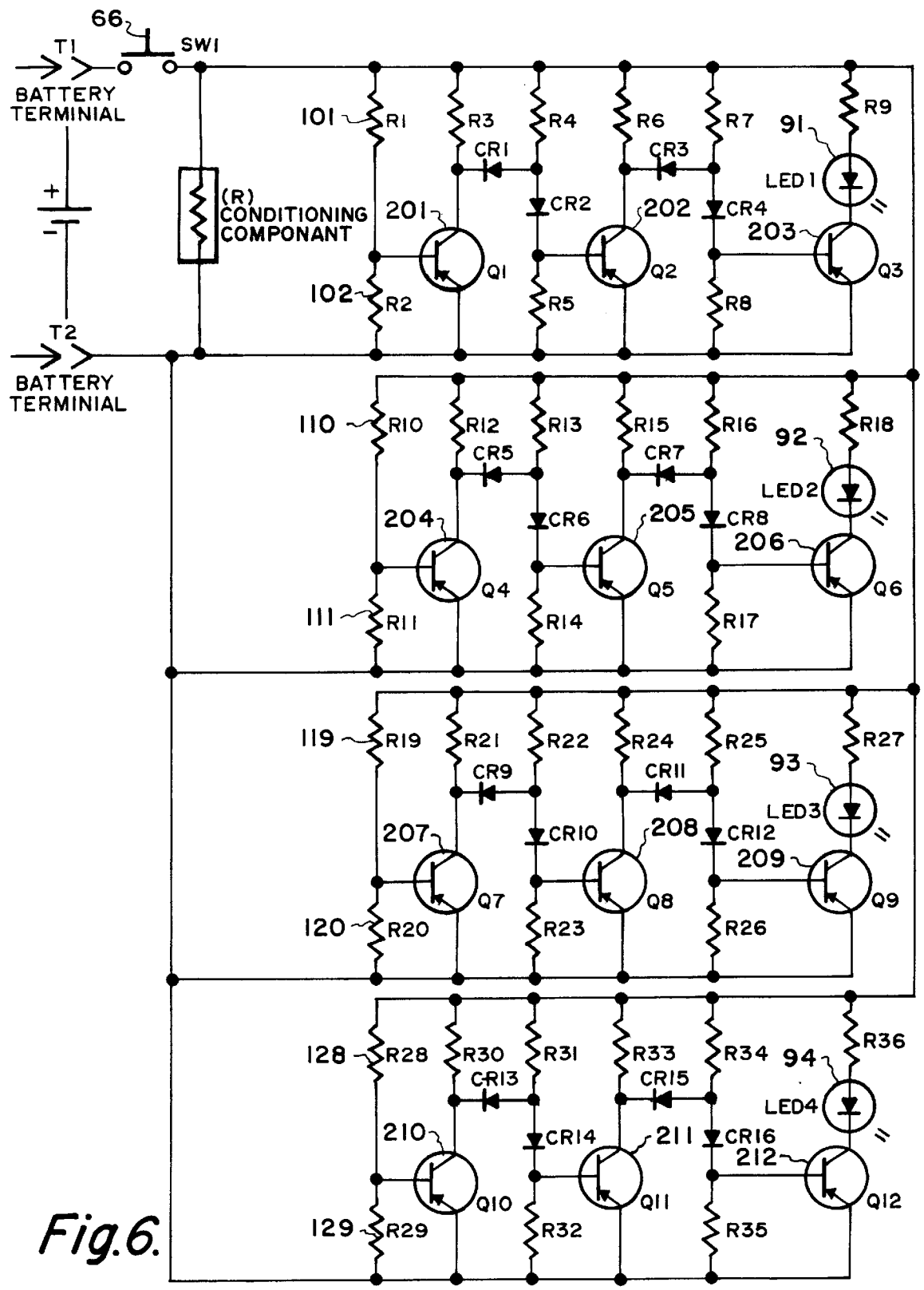
FIG. 6 is a circuit diagram of an alternate embodiment to the tester circuitry.

FIG. 6 shows an alternate embodiment of the testers electronic circuit. When the switch 66 is depressed and held, power is supplied to the circuit from the battery being tested. When the voltage trip level set by the series resistors 101 and 102, 110 and 111, 119 and 120, 128 and 129 is reached, the first transistor 201, 204, 207, or 210 turns on, which then turns off the second transistor 202, 205, 208, or 211. When the second transistor turns off, this turns on the third transistor 203, 206, 209, or 212. With the third transistor on, an indicator LED 91, 92, 93, or 94 turns on indicating the the appropriate voltage level is present. The diodes CR1 thru CR16, of type 1N914, are used to fully turn on or off the succeeding transistor. LED 91 is set to illuminate if the battery voltage above 10.4 volts, LED 92 is set to illuminate if the battery voltage above 10.0 volts, LED 93 is set to illuminate if the battery voltage above 9.2 volts, LED 94 is set to illuminate if the battery voltage above 8.4 volts.

The battery under test must have at least 8.4 volts present for at least one light to illuminate. If no lights illuminate the battery is presumed to have less than 8.4 volts present. The voltage comparisons and LED indications are typically completed in less than one second.

What is claimed is:

1. A device for testing a battery comprising:
   (a) at least two electrical contacts for connection to battery contacts;
   (b) a conditioning resistor for loading the battery, the conditioning resistor being connected at one end to one of the contacts, and the other end of the conditioning resistor being connected to the other of the contacts; and
   (c) an electrical circuit for testing the loaded battery and producing an immediate indication of the charge level on the loaded battery; the electrical circuit further comprising a switch interposed between one end of the conditioning resistor and the respective battery terminal such that the closing of the switch loads the previously unloaded battery and provides power to the tester circuit.

2. A device for rapidly testing a battery comprising:
   (a) at least two electrical contacts for connection to battery contacts;
   (b) a conditioning resistor for loading the battery that would draw approximately the full current the battery can generate when fully charged, the conditioning resistor being connected at one end to one of the contacts, and its other end being connected to the other of the contacts; and
   (c) an electrical circuit for testing the loaded battery and producing an immediate indication of the charge level on the loaded battery; the electrical circuit further comprising a depressible momentary type switch interposed between one end of the conditioning resistor and the respective battery terminal such that the closing of the switch loads the previously unloaded battery and provides power to the tester circuit.

3. The device of claim 2 wherein the circuit is powered solely by the battery under test.

4. The device of claim 2 wherein the electrical contacts have at least a partially textured surface such that the mating of the tester contacts with the battery contacts causes sufficient friction so as to wipe away any debris present on the battery contacts.

5. The device of claim 2 including at least one light emitting diode for indicating the charge level of the battery.

6. The device of claim 2 which further includes at least one voltage divider and comparator working in conjunction with each other to compare a divided down battery voltage with a fixed voltage reference.

7. The device of claim 2 which further includes a plurality of voltage dividers and comparators working in conjunction with each other to compare a divided down battery voltage with a fixed voltage reference, each comparator having an associated indicator light such that all the indicator lights will light up if the battery is at full capacity, and less than all the indicator lights will light up if the battery is at less than full capacity.

8. A device for rapidly testing a battery comprising:
   (a) at least two electrical contacts for connection to battery contacts, the electrical contacts of the tester having at least a partially textured surface such that the mating of the tester contacts with the battery contacts causes sufficient friction to wipe away any debris present on the battery contacts;
   (b) a conditioning resistor for loading the battery, that would draw approximately the full current the battery can generate when fully charged, the conditioning resistor being connected at one end to one of the tester contacts, and its other end being connected to the other of the tester contacts; and (c) an electrical circuit for testing the loaded battery and producing an immediate indication of the charge level on the loaded battery; the electrical circuit further comprising a depressible momentary type switch interposed between one end of the conditioning resistor and the respective battery terminal such that the closing of the switch loads the previously unloaded battery and provides power to the tester circuit; the electrical circuit further comprising a plurality of sets of voltage dividers and comparators working in conjunction with each other to compare a divided down battery voltage with a fixed voltage reference, each comparator having an associated indicator light such that all the indicator lights will light up if the battery is at full capacity, but less than all the indicator lights will light up if the battery is at less than full capacity.

9. The device of claim 8 wherein the circuit is powered solely by the battery under test.

* * * * *